(12) United States Patent
Liu

(10) Patent No.: US 11,069,565 B2
(45) Date of Patent: Jul. 20, 2021

(54) SEMICONDUCTOR INTERCONNECT STRUCTURE AND MANUFACTURING METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventor: Jiquan Liu, Shanghai (CN)

(73) Assignees: Semiconductor Manufacturing International (Beijing) Corporation; Semiconductor Manufacturing International (Shanghai) Corporation

(*) Notice: Subject to any disclaimer, the term of this patent is extended or adjusted under 35 U.S.C. 154(b) by 0 days.

(21) Appl. No.: 16/373,343

(22) Filed: Apr. 2, 2019

(65) Prior Publication Data

US 2019/0229015 A1 Jul. 25, 2019

Related U.S. Application Data

(62) Division of application No. 15/627,961, filed on Jun. 20, 2017, now Pat. No. 10,290,539.

(30) Foreign Application Priority Data

Jul. 1, 2016 (CN) .......................... 201610512830.1

(51) Int. Cl.
*H01L 21/768* (2006.01)
*H01L 23/522* (2006.01)
*H01L 23/532* (2006.01)

(52) U.S. Cl.
CPC .. *H01L 21/76843* (2013.01); *H01L 21/76802* (2013.01); *H01L 21/76805* (2013.01);
(Continued)

(58) Field of Classification Search
CPC .......... H01L 21/76877; H01L 23/5226; H01L 21/76802; H01L 21/76831;
(Continued)

(56) References Cited

U.S. PATENT DOCUMENTS 5,639,691 A * 6/1997 Klein ................ H01L 21/76805
438/652
6,011,311 A * 1/2000 Hsing ................. H01L 23/5226
257/741

(Continued)

FOREIGN PATENT DOCUMENTS

EP 3264452 A1 1/2018
JP 2007-042662 A 9/2008

OTHER PUBLICATIONS

European Search Report corresponding to EP17178158.6, dated Nov. 17, 2017, 2 pages.

(Continued)

*Primary Examiner* — David A Zarneke
(74) *Attorney, Agent, or Firm* — Innovation Counsel LLP

(57) ABSTRACT

A semiconductor interconnect structure and its manufacturing method are presented. The manufacturing method includes:
  providing a substrate structure, wherein the substrate structure comprises:
    a substrate;
    a first metal layer on the substrate;
    a dielectric layer on the substrate, wherein the dielectric layer covers the first metal layer, and wherein the dielectric layer has a hole extending to the first metal layer; and
    a hard mask layer on the dielectric layer;
  removing the hard mask layer on the dielectric layer;
  selectively depositing a second metal layer at the bottom of the hole; and (Continued)

depositing a third metal layer, wherein the third metal layer fills the hole.
This semiconductor interconnect structure provides improved reliability over conventional structures.

8 Claims, 4 Drawing Sheets

(52) U.S. Cl.
CPC .. *H01L 21/76807* (2013.01); *H01L 21/76846* (2013.01); *H01L 21/76849* (2013.01); *H01L 23/5226* (2013.01); *H01L 23/53238* (2013.01)

(58) Field of Classification Search
CPC ......... H01L 23/53295; H01L 21/76805; H01L 21/76807; H01L 21/76816
USPC ....................................... 257/750, 751, 767
See application file for complete search history.

(56) References Cited

U.S. PATENT DOCUMENTS

| | | | | |
|---|---|---|---|---|
| 6,323,554 B1* | 11/2001 | Joshi | ................ | H01L 23/53228 257/758 |
| 7,030,016 B2* | 4/2006 | Feng | ................ | H01L 21/76877 257/E21.585 |
| 7,192,871 B2* | 3/2007 | Maekawa | ......... | H01L 21/76805 257/E21.579 |
| 7,629,248 B2* | 12/2009 | Kim | ................ | H01L 21/76805 257/E21.294 |
| 7,872,351 B2* | 1/2011 | Kim | ................ | H01L 21/76805 257/751 |
| 7,879,720 B2* | 2/2011 | Jang | ................ | H01L 21/76805 438/640 |
| 7,985,928 B2* | 7/2011 | Bolom | ................ | H01L 23/5226 174/261 |
| 8,298,931 B2* | 10/2012 | Raghuram | ........ | H01L 21/76808 438/620 |
| 8,432,037 B2* | 4/2013 | Maekawa | ......... | H01L 21/76844 257/758 |
| 8,546,227 B2* | 10/2013 | Chuang | ............... | H01L 29/4966 438/299 |
| 8,791,014 B2* | 7/2014 | Zhang | ............... | H01L 21/76805 438/653 |
| 8,796,853 B2* | 8/2014 | Yang | ................ | H01L 21/76882 257/751 |
| 9,136,206 B2* | 9/2015 | Su | ..................... | H01L 21/28088 |
| 9,245,795 B2* | 1/2016 | Boyapati | ........... | H01L 21/76873 |
| 9,368,603 B2* | 6/2016 | Chuang | ............. | H01L 21/28114 |
| 9,437,540 B2* | 9/2016 | Lin | ............. | H01L 21/76814 |
| 10,032,712 B2* | 7/2018 | Chen | ................... | H01L 23/5329 |
| 2002/0109234 A1* | 8/2002 | Park | ................... | H01L 21/76807 257/767 |
| 2003/0111735 A1* | 6/2003 | Lee | ................... | H01L 21/76844 257/774 |
| 2003/0194872 A1* | 10/2003 | Parikh | ............... | H01L 21/76838 438/694 |
| 2003/0207560 A1 | 11/2003 | Dubin et al. | | |
| 2005/0032266 A1* | 2/2005 | Suzuki | ................. | B81B 3/0054 438/50 |
| 2006/0170103 A1* | 8/2006 | Suh | ................... | H01L 21/76846 257/751 |
| 2006/0194430 A1 | 8/2006 | Beck | | |
| 2006/0289993 A1* | 12/2006 | Ahn | ................... | H01L 21/76831 257/751 |
| 2007/0284744 A1* | 12/2007 | Dubin | ................. | H01L 21/7682 257/751 |
| 2008/0080112 A1 | 4/2008 | Lin et al. | | |
| 2008/0203570 A1 | 8/2008 | Edelstein et al. | | |
| 2009/0194875 A1* | 8/2009 | Yang | ................. | H01L 23/53238 257/751 |
| 2010/0171220 A1* | 7/2010 | Huang | ............. | H01L 21/76843 257/751 |
| 2010/0314765 A1* | 12/2010 | Liang | ................ | H01L 21/76879 257/751 |
| 2011/0256718 A1 | 10/2011 | Haukka et al. | | |
| 2013/0075908 A1* | 3/2013 | Cabral, Jr. | .......... | H01L 23/5226 257/751 |
| 2013/0119440 A1 | 5/2013 | Ackerson et al. | | |
| 2013/0127055 A1* | 5/2013 | Chen | ................ | H01L 21/76847 257/751 |
| 2013/0214416 A1* | 8/2013 | Edelstein | .......... | H01L 21/76867 257/751 |
| 2015/0069620 A1 | 3/2015 | Chi et al. | | |
| 2016/0104638 A1* | 4/2016 | Preusse | ............. | H01L 21/76873 257/751 |

OTHER PUBLICATIONS

Communication from European Patent Office for European Application No. 17178158.6, dated Nov. 16, 2020, pp. 1-4.

* cited by examiner

SEMICONDUCTOR INTERCONNECT STRUCTURE AND MANUFACTURING METHOD THEREOF

CROSS-REFERENCE TO RELATED APPLICATIONS

This application is a divisional application of U.S. patent application Ser. No. 15/627,961 filed on Jun. 20, 2017, which claims priority to Chinese Patent Application No. 201610512830.1 filed on Jul. 1, 2016 and all the benefits accruing therefrom under 35 U.S.C. § 119, the contents of the prior applications being herein incorporated by reference.

BACKGROUND

(a) Field of the Invention

This inventive concept relates generally to a semiconductor technology, and more specifically to a semiconductor interconnect structure and its manufacturing method.

(b) Description of Related Arts

Establishing a reliable inter-layer connection in semiconductor devices is an increasingly challenging problem due to reduction of critical dimension.

FIG. 1 shows a diagram of a conventional semiconductor interconnect structure. In this structure, after a through-hole and a trench are filled with a metal 101, one or more cavities 104 may be formed between a first metal layer 102 and a dielectric layer 103. The cavities 104 may cut off the inter-layer connection, thus reducing the liability of the interconnect structure.

Therefore, a new semiconductor interconnect structure that can provide improved reliability is desirable.

SUMMARY

This summary is related to some of many embodiments of the inventive concept disclosed herein and is not intended to limit the scope of the inventive concept.

A method of manufacturing a semiconductor interconnect structure, comprising:
a substrate;
a first metal layer on the substrate;
a dielectric layer on the substrate, wherein the dielectric layer covers the first metal layer, and wherein the dielectric layer has a hole extending to the first metal layer; and
a hard mask layer on the dielectric layer;
removing the hard mask layer on the dielectric layer;
selectively depositing a second metal layer at the bottom of the hole; and
depositing a third metal layer, wherein the third metal layer fills the hole.

Additionally, in the aforementioned method, the hard mask layer may be removed by a wet etching method.

Additionally, in the aforementioned method, the wet etching method may use one or more of the following agents as etching agent: hydrogen peroxide, diluted hydrofluoric acid, sulfuric acid, hydrochloric acid, and ammonium hydroxide.

Additionally, in the aforementioned method, before the third metal layer is formed, a barrier layer may be formed on the hole.

Additionally, in the aforementioned method, before the third metal layer is formed, a crystallized layer may be formed on the barrier layer.

Additionally, in the aforementioned method, the barrier layer may be made of tantalum nitride (TaN), tantalum (Ta), or a multi-layer structure comprising tantalum nitride (TaN) and tantalum (Ta).

Additionally, the aforementioned method may further comprise:
applying a planarization process on an upper surface of the third metal layer, so that the upper surface of the third metal layer and an upper surface of the dielectric layer are at the same horizontal level after the planarization process.

Additionally, in the aforementioned method, the first metal layer and the third metal layer may both be made of copper (Cu), and the second metal layer may be made of cobalt (Co).

Additionally, in the aforementioned method, the width of the hole may be 30-100 nm, and the depth of the hole may be 100-300 nm.

Additionally, in the aforementioned method, the hole may be formed by a Damascene or Dual-Damascene fabrication process.

Additionally, in the aforementioned method, the hard mask layer may comprise:
a silicon carbonitride layer on the dielectric layer outside the hole;
a low-K dielectric layer on the silicon carbonitride layer;
a tetraethyl orthosilicate (TEOS) layer on the low-K dielectric layer;
an octamethyl cyclotetrasiloxane (D4) layer on the tetraethyl orthosilicate layer; and
a titanium nitride (TiN) layer on the octamethyl cyclotetrasiloxane (D4) layer.

This inventive concept further presents a semiconductor interconnect structure, comprising:
a substrate;
a first metal layer on the substrate;
a dielectric layer on the substrate, wherein the dielectric layer covers the first metal layer, and wherein the dielectric layer has a hole extending to the first metal layer;
a second metal layer on the first metal layer at the bottom of the hole; and
a third metal layer on the second metal layer, wherein the third metal layer fills the hole.

Additionally, the aforementioned structure may further comprise:
a barrier layer between the second metal layer and the third metal layer, and between the third metal layer and the dielectric layer.

Additionally, the aforementioned structure may further comprise:
a crystallized layer between the third metal layer and the barrier layer.

Additionally, in the aforementioned structure, the barrier layer may be made of tantalum nitride (TaN), tantalum (Ta), or a multi-layer structure comprising tantalum nitride (TaN) and tantalum (Ta).

Additionally, in the aforementioned structure, the first metal layer and the third metal layer may both be made of copper (Cu), and the second metal layer may be made of cobalt (Co).

Additionally, in the aforementioned structure, the width of the hole may be 30-100 nm, and the depth of the hole may be 100-300 nm.

Additionally, in the aforementioned structure, the hole may be formed by a Damascene or Dual-Damascene fabrication process.

DETAILED DESCRIPTION OF THE EMBODIMENTS

Figure 1:
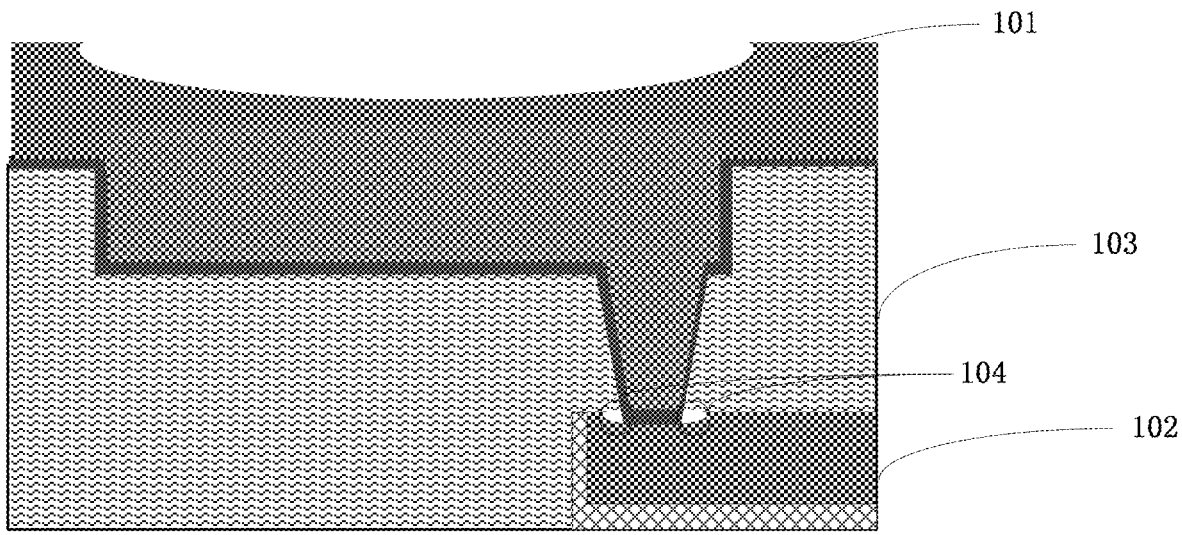
FIG. 1 shows a diagram of a conventional semiconductor interconnect structure.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

FIG. 1 shows a diagram of a conventional semiconductor interconnect structure. In conventional manufacturing methods, a wet etching method will typically be used to remove a hard mask layer (such as a TiN layer) on a dielectric layer 103. The wet etching method may also etch a portion of a first metal layer 102 at the bottom of the through-hole and form an undercut between the first metal layer 102 and the dielectric layer 103. The undercut may not be filled by a filling metal 101 in the filling process and will form one or more cavities 104. The cavities 104 will adversely affect device reliability, hence a new manufacturing method that will not result in cavities in the structure is desirable.

Figure 2:
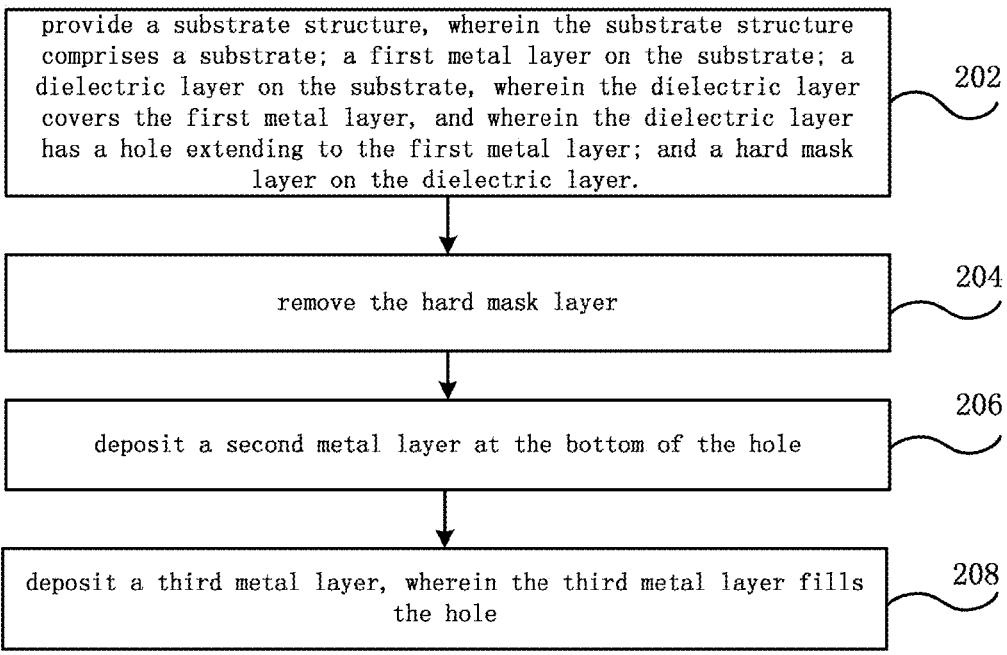
FIG. 2 shows a flowchart that illustrates a method of manufacturing a semiconductor interconnect structure in accordance with one or more embodiments of this inventive concept.

FIG. 2 shows a flowchart that illustrates the steps in a method of manufacturing a semiconductor interconnect structure in accordance with one or more embodiments of this inventive concept. The method comprises the following steps:

Step 202, provide a substrate structure, wherein the substrate structure comprises:
  a substrate;
  a first metal layer on the substrate;
  a dielectric layer on the substrate, wherein the dielectric layer covers the first metal layer, and wherein the dielectric layer has a hole extending to the first metal layer; and
  a hard mask layer on the dielectric layer.

Step 204, remove the hard mask layer. The hard mask layer may be removed by a wet etching method.

Step 206, deposit a second metal layer at the bottom of the hole.

Step 208, deposit a third metal layer, wherein the third metal layer fills the hole.

In this embodiment, after the hard mask layer is removed, a second metal layer is selectively deposited at the bottom of the hole. The second metal layer can fill the undercut between the first metal layer and the dielectric layer, thus eliminate the cavities that will otherwise be formed after the third metal layer is deposited in the hole. Therefore, this method improves the reliability of the resulting interconnect structure.

FIGS. 3A, 3B, 3C, 3D, and 3E show diagrams depicting different stages of a method of manufacturing a semiconductor interconnect structure in accordance with one or more embodiments of this inventive concept. Detailed description of this manufacturing method is present below. Some of the manufacturing procedures described below are optional procedures.

Figure 3A:
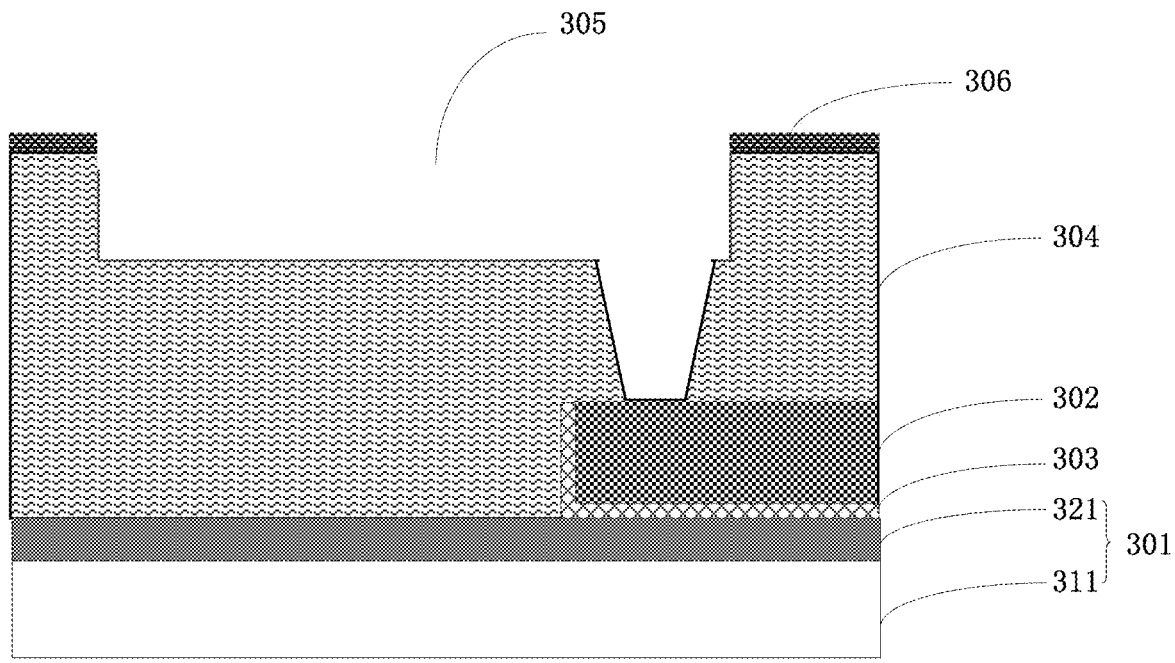
FIGS. 3A, 3B, 3C, 3D, and 3E show diagrams depicting different stages of a method of manufacturing a semiconductor interconnect structure in accordance with one or more embodiments of this inventive concept.

Referring to FIG. 3A, a substrate structure is provided. The substrate structure comprises a substrate 301, which comprises a semiconductor substrate 311 and a first barrier layer 321 on the semiconductor substrate 311. The semiconductor substrate 311 may further comprise other semiconductor devices and shallow trench isolations (not shown).

The substrate structure may further comprise a first metal layer 302 on the substrate 301. The first metal layer 302 may be made of a metallic material such as copper (Cu). In one embodiment, a second barrier layer 303 may be formed on the side and bottom of the first metal layer 302. The second barrier layer 303 may be made of tantalum (Ta), tantalum nitride (TaN), or a multi-layer structure comprising tantalum nitride (TaN) and tantalum (Ta).

The substrate structure may further comprise a dielectric layer 304, wherein the dielectric layer 304 is on the substrate 301 and covers the first metal layer 302. The dielectric layer 304 has a hole 305 extending to an upper surface of the first metal layer 302. In one embodiment, the hole 305 is formed by a Damascene or Dual-Damascene fabrication process. FIG. 3A shows a hole 305 that is formed by a Dual-Damascene fabrication process. That is, the hole 305 comprises a trench in its upper part and a through-hole in its lower part. In one embodiment, the width of the hole 305 is 30-100 nm, the depth of the hole 305 is 100-300 nm. When the hole 305 is formed by a Dual-Damascene fabrication process, the width of the trench and the through-hole is 30-100 nm, the depth of the trench and the through-hole is 100-300 nm. The Damascene or Dual-Damascene fabrication process that forms the hole 305 is well known to a person of ordinary skill in the art in this area. Thus, the details of these processes are omitted in the interest of brevity.

The substrate structure may further comprise a hard mask layer 306 on the dielectric layer 304. Referring to FIG. 3A, the hard mask layer 306 may be on a portion of the dielectric layer 304 that is outside the hole 305. In one embodiment, the hard mask layer 306 may comprise a silicon carbonitride layer on the dielectric layer 304, a low-K dielectric layer on the silicon carbonitride layer, a tetraethyl orthosilicate (TEOS) layer on the low-K dielectric layer, an octamethyl cyclotetrasiloxane (D4) layer on the tetraethyl orthosilicate layer, and a titanium nitride (TiN) layer on the octamethyl cyclotetrasiloxane (D4) layer. The silicon carbonitrde layer may have a thickness of 100-400 Angstrom, the low-K dielectric layer may have a thickness of 1000-2000 Angstrom and a dielectric constant (K-value) of 2-3, the tetraethyl orthosilicate (TEOS) layer may have a thickness of 100-400 Angstrom, the octamethyl cyclotetrasiloxane (D4) layer may have a thickness of 100-400 Angstrom, and the titanium nitride (TiN) layer may have a thickness of 100-300 Angstrom.

Figure 3B:
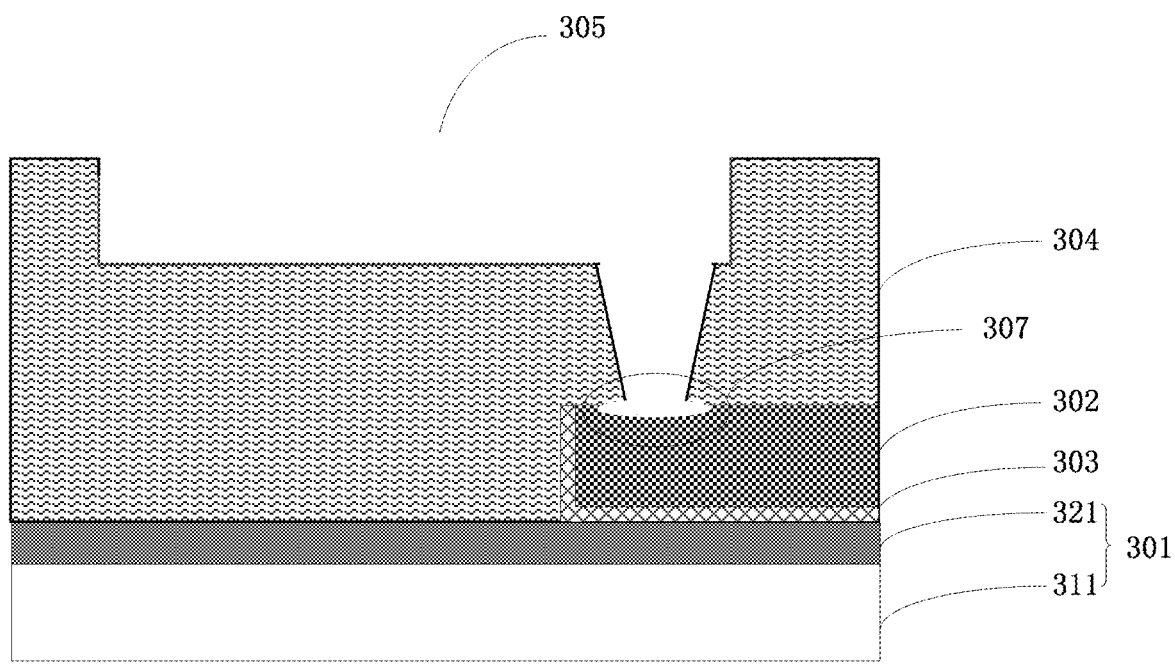

Referring to FIG. 3B, the hard mask layer 306 on the dielectric layer 304 is removed. In one embodiment, the hard mask layer 306 can be removed by a wet etching method. The wet etching method may use one or more of the following agents as etching agent: hydrogen peroxide, diluted hydrofluoric acid, sulfuric acid, hydrochloric acid, and ammonium hydroxide. The hard mask layer 306 may induce horizontal stress on the hole 305, which causes horizontal deformation of the hole 305. Therefore the removal of the hard mask layer 306 may reduce horizontal deformation and facilitate the filling process of the hole 305. For a hole that comprises both a trench and a through-hole, the horizontal deformation due to the hard mask layer 306 is mainly the deformation of the trench along the trench direction. Referring to FIG. 3B, an undercut 307 may result after the hard mask layer 306 is removed.

Figure 3C:
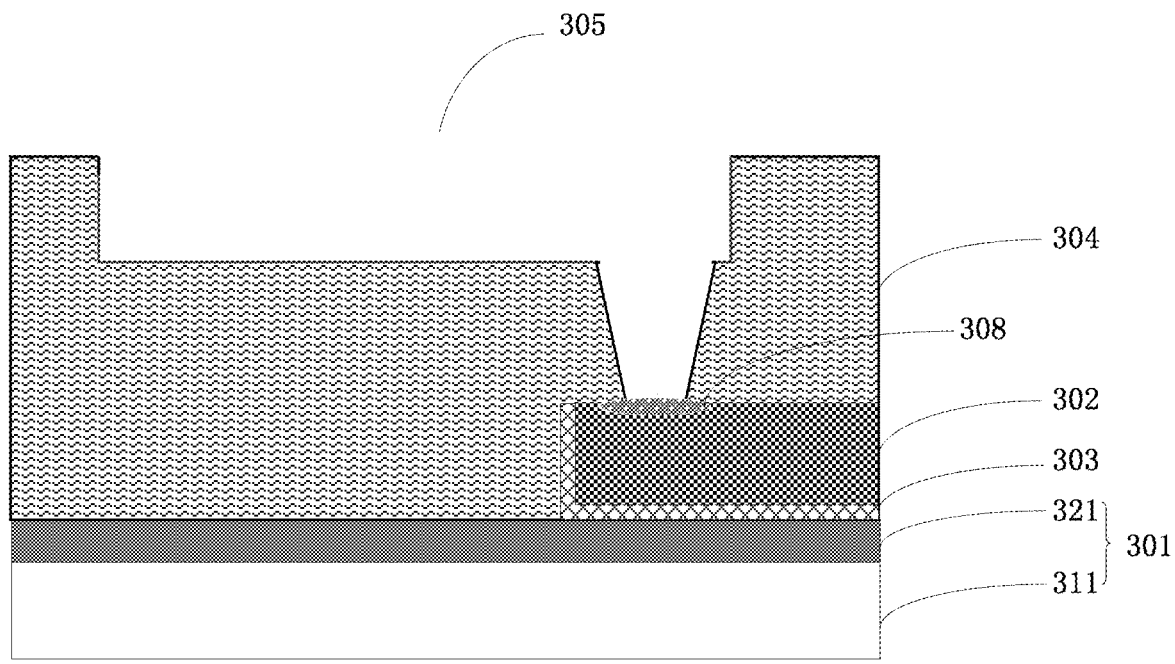

Referring to FIG. 3C, a second metal layer 308 is selectively deposited at the bottom of the hole 305. In one embodiment, the second metal layer 308 may be deposited by Chemical Vapor Deposition (CVD). Since the second metal layer 308 is selectively deposited, it is deposited only on the first metal layer 302 and not on the dielectric layer 304. Hence the second metal layer 308 can completely fill the undercut 307. Optimally, the second metal layer 308 may be made of cobalt (Co). Choosing cobalt for the second metal layer 308 has the following benefits: first, cobalt has a good selectivity characteristic in deposition; second, cobalt can also be used as a barrier material to prevent the diffusion of the metal layer that will be deposited in succeeding stages; third, cobalt spreads to completely fill the undercut 307.

Figure 3D:
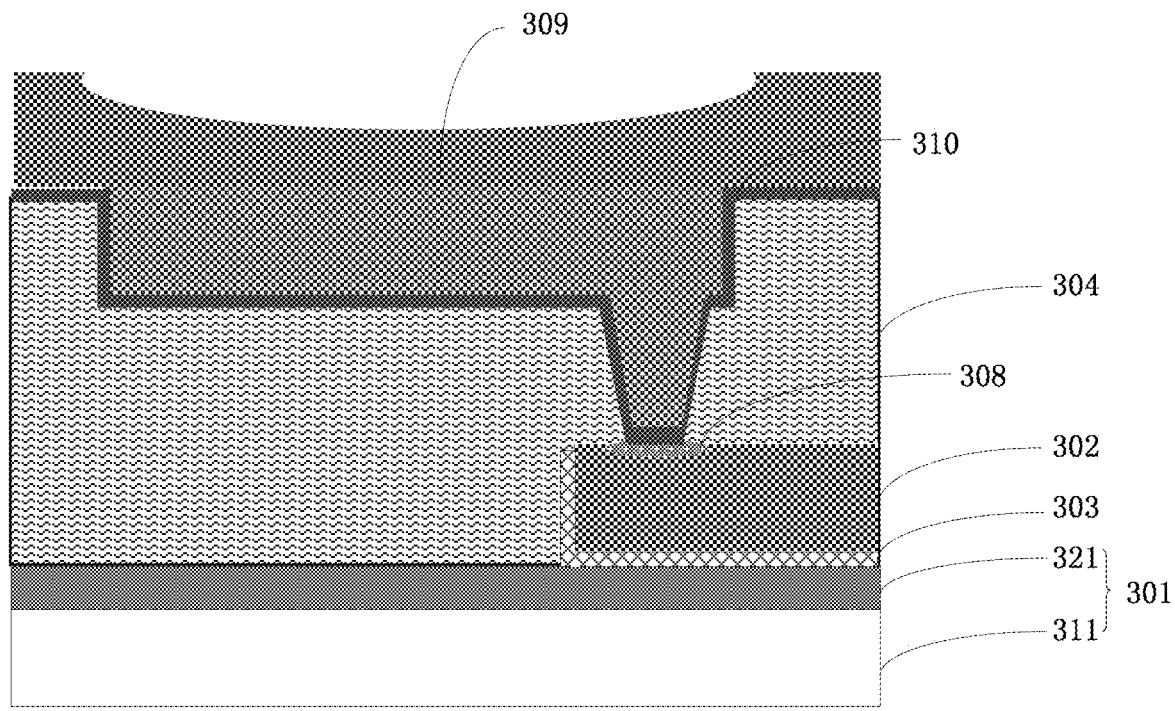

Referring to FIG. 3D, a third metal layer 309 is deposited to fill the hole 305. The third metal layer 309 may be made of copper (Cu) and may be deposited by Electrochemical Plating (ECP).

Optimally, before the third metal layer 309 is deposited, a third barrier layer 310 may be deposited on the hole 305. As shown in FIG. 3C the third barrier layer 310 is formed on the bottom surfaces and the walls of the hole 305. In one embodiment, the third barrier layer 310 may be made of tantalum nitride (TaN), tantalum (Ta), or a multi-layer structure comprising tantalum nitride (TaN) and tantalum (Ta). The third barrier layer 310 may have a thickness of 2-20 nm. Optimally, before the third metal layer 309 is deposited to fill the hole 305, a crystallized layer (not shown) may be formed on the third barrier layer 310. The crystallized layer may be made of copper (Cu) and have a thickness of 5-100 nm. Optimally, the third barrier layer 310 and the crystallized layer may both be deposited by Physical Vapor Deposition (PVD).

Figure 3E:
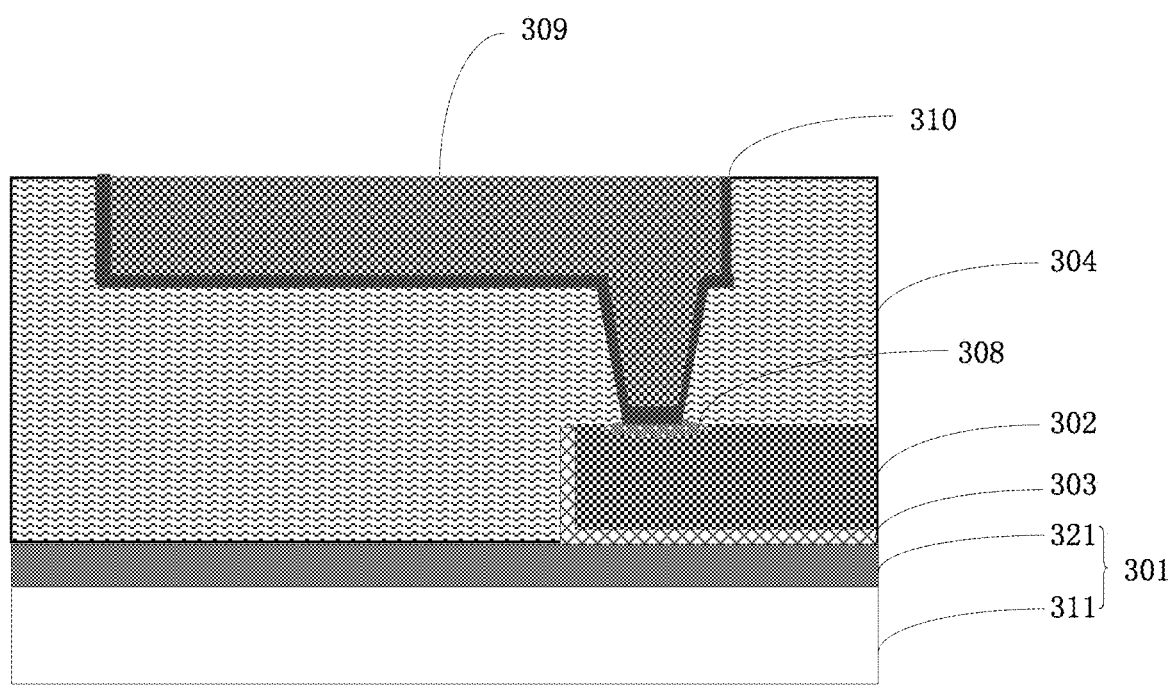

Referring to FIG. 3E, a planarization process may be applied on an upper surface of the third metal layer 309 so that the upper surface of the third metal layer 309 and an upper surface of the dielectric layer 304 will be at the same horizontal level after the planarization process. The planarization process may comprise a Chemical Mechanical Polishing (CMP) process.

This concludes the description of a method of manufacturing a semiconductor interconnect structure in accordance with one or more embodiments of this inventive concept. This inventive concept further presents a semiconductor interconnect structure, which will be described below.

Referring to FIG. 3E, the semiconductor interconnect structure comprises:

a substrate 301;

a first metal layer 302 on the substrate 301;

a dielectric layer 304 on the substrate 301, wherein the dielectric layer 304 covers the first metal layer 302, and wherein the dielectric layer 304 has a hole extending to the first metal layer 302;

a second metal layer 308 on the first metal layer 302 at the bottom of the hole, wherein the second metal layer 308 is formed by selective deposition; and a third metal layer 309 on the second metal layer 308, wherein the third metal layer 309 fills the hole.

In this semiconductor interconnect structure, the second metal layer 308 is formed on the first metal layer 302 at the bottom of the hole, it can fill the undercut between the first metal layer 302 and the dielectric layer 304 and eliminate the cavities that will otherwise be formed. Therefore, this structure improves reliability of inter-layer connection.

Referring to FIG. 3E, in one embodiment, this semiconductor interconnect structure may further comprise a barrier layer 310 between the second metal layer 308 and the third metal layer 309, and between the dielectric layer 304 and the third metal layer 309. The barrier layer 310 may be made of tantalum nitride (TaN), tantalum (Ta), or a multi-layer structure comprising tantalum nitride (TaN) and tantalum (Ta). Additionally, the semiconductor interconnect structure may further comprise a crystallized layer between the barrier layer 310 and the third metal layer 309.

Layers of this semiconductor interconnect structure, such as the first metal layer, the second metal layer, the third metal layer, the barrier layer, and the crystallized layer, may have the same composition and thickness of the corresponding layer described in the manufacturing method. Hence, these implementation details are omitted for conciseness.

While this inventive concept has been described in terms of several embodiments, there are alterations, permutations, and equivalents, which fall within the scope of this disclosure. It shall also be noted that there are alternative ways of implementing the methods and apparatuses of the inventive concept. Furthermore, embodiments may find utility in other applications. The abstract section is provided herein for convenience and, due to word count limitation, is accordingly written for reading convenience and shall not be employed to limit the scope of the claims. It is therefore intended that the claims be interpreted as including all such alterations, permutations, and equivalents.

What is claimed is:

1. A semiconductor interconnect structure, comprising:
   a substrate;
   a first metal layer overlapping the substrate and having a cavity;
   a dielectric layer overlapping the substrate, partially covering the first metal layer, having an undercut, and having a hole;
   a second metal layer positioned inside the cavity and completely filling the undercut; and
   a third metal layer overlapping the second metal layer and positioned inside the hole.

2. The structure of claim 1, further comprising: a barrier layer between the second metal layer and the third metal layer, and between the third metal layer and the dielectric layer.

3. The structure of claim 2, further comprising: a crystallized layer between the third metal layer and the barrier layer.

4. The structure of claim 2, wherein the barrier layer is made of tantalum nitride (TaN), tantalum (Ta), or a multi-layer structure comprising tantalum nitride (TaN) and tantalum (Ta).

5. The structure of claim 1, wherein the first metal layer and the third metal layer are both made of copper (Cu), and wherein the second metal layer is made of cobalt (Co).

6. The structure of claim 1, wherein the width of the hole is in a range of 30-100 nm, the depth of the hole is in a range of 100-300 nm.

7. The structure of claim 1, wherein the hole is formed by a Damascene or Dual-Damascene fabrication process.

8. The structure of claim 2, wherein the barrier layer protrudes into the second metal layer.

* * * * *